United States Patent
Yamada

(10) Patent No.: US 6,743,043 B2
(45) Date of Patent: Jun. 1, 2004

(54) SOCKET FOR ELECTRICAL PARTS HAVING SEPARABLE PLUNGER

(75) Inventor: Takayuki Yamada, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/075,764

(22) Filed: Feb. 15, 2002

(65) Prior Publication Data
US 2002/0115337 A1 Aug. 22, 2002

(30) Foreign Application Priority Data

Feb. 19, 2001 (JP) .......................................... 2001-041778

(51) Int. Cl.[7] ............................ H01R 11/18; G01R 31/02
(52) U.S. Cl. ........................ 439/482; 324/754; 324/755
(58) Field of Search .......................... 439/700, 66, 482; 324/755, 754

(56) References Cited

U.S. PATENT DOCUMENTS

| | | | | |
|---|---|---|---|---|
| 6,046,597 A | * | 4/2000 | Barabi .......................... | 324/755 |
| 6,084,421 A | * | 7/2000 | Swart et al. .................. | 324/755 |
| 6,208,155 B1 | * | 3/2001 | Barabi et al. ................. | 324/754 |
| 6,292,003 B1 | * | 9/2001 | Fredrickson et al. ......... | 324/754 |
| 6,424,166 B1 | * | 7/2002 | Henry et al. .................. | 324/755 |
| 6,464,511 B1 | * | 10/2002 | Watanabe et al. ............. | 439/66 |

\* cited by examiner

*Primary Examiner*—Chandrika Prasad
(74) *Attorney, Agent, or Firm*—Staas & Halsey LLP

(57) ABSTRACT

A socket for an electrical part comprises a socket body and a contact pin through which an electrical part having a terminal and a printed circuit board are electrically connected. The socket body is provided with a lower plate to be mounted to the printed circuit board and an upper plate which is disposed above the lower plate and on which the electrical part is mounted. The upper plate is exchanged with one having a seating portion of different height. A contact portion of the contact pin is also exchangeable with one having different shape or type.

17 Claims, 6 Drawing Sheets

SOCKET FOR ELECTRICAL PARTS HAVING SEPARABLE PLUNGER

BACKGROUND OF THE INVENTION

1. Field of the Invention

The present invention relates to a socket for electrical parts for detachably accommodating and holding an electrical part such as a semiconductor device (called as "IC package" hereinafter), and more particularly, relates to a socket for electrical parts having elements or parts commonly utilized for different electrical parts.

2. Prior Art of the Invention

In known art, there have been provided IC sockets, as "socket for electrical parts" mentioned above, for carrying out performance tests of IC packages as "electrical part".

In such IC socket, a number of contact pins are arranged on a socket body and, in use, the socket body is mounted on a printed circuit board with the IC package being mounted on the socket body. In this state, the contact pins contact terminals of the IC package to thereby establish an electrical connection between the IC socket and the printed circuit board.

In such prior art as mentioned above, however, the IC packages include various types or kinds such as LGA (Land Grid Array), BGA (Ball Grid Array) and PGA (Pin Grid Array), which have different shapes of terminals. Accordingly, it has been required to change the entire of the IC socket when a different type of IC package is used and handled, thus being inconvenient and not economical.

SUMMARY OF THE INVENTION

An object of the present invention is to substantially eliminate defects or inconveniences encountered in the prior art mentioned above and to provide a socket for electrical parts having elements or parts commonly utilized for electrical parts, even if kinds or types thereof are different, without exchanging the entire structure of the socket.

This and other objects can be achieved according to the present invention by providing a socket for an electrical part comprising: a socket body; and a contact pin which is provided for the socket body and through which an electrical part having a terminal and a printed circuit board are electrically connected, in which the socket body has a lower plate to be mounted to the printed circuit board and an upper plate which is disposed above the lower plate and on which the electrical part is mounted, wherein the upper plate has a seating portion on which the electrical part is placed in a contacting manner, and the upper plate is exchanged with another one having a seating portion of different height.

According to this aspect, since the upper plates having the seating portions of different heights can be selected and exchanged in accordance with kinds or types of the electrical parts to be used, the lower plate can be commonly utilized while maintaining the contacting pressure between the terminal of the electrical part and the contact pin.

Another preferred aspect of the present inventions is that the contact pin is exchangeable for another one having a different contact shape in accordance with a shape of a terminal of the electrical part.

According to the foregoing aspect of the present invention, the conductive performances between the contact portions of the contact pins and the terminals of the electrical part can be improved.

Another aspect of the present invention is that the contact pin comprises a first plunger electrically connected to the terminal of the electrical part, a second plunger electrically connected to the printed circuit board, a tubular member disposed between the first and second plungers and an elastic member disposed therebetween, the tubular member having one end abutting against one of the first and second plungers and another end slidably contacting other one of the first and second plungers, the elastic member having an urging force for urging the first and second plungers in directions apart from each other, and the first plunger is exchangeable for another one having a different contact shape in accordance with a shape of the terminal of the electrical part.

According to the foregoing aspect of the present invention, the first plungers of the contact pin is exchangeable so that the conductive performance can be also improved with other many parts or elements being common.

Still another aspect of the present invention is that the lower plate is formed with a plurality of lower side through holes into which the second plunger can be inserted, the low side through holes being formed in an arrangement range wider than that of an upper side through holes.

According to the foregoing aspect of the present invention, the socket can be used for an electrical part having different size or shape, or having different number of terminals.

The contact portion may have a mount shape to which a terminal having a land shape contacts. The contact portion may have a V-shaped groove to which a terminal having a solder ball shape or round shape contacts.

According to the foregoing aspect of the present invention, the contact portion of the V-shaped groove makes it possible to avoid damage at the lowest portion of the terminals having round shape. The contact portion may have a plural mount-shape to which a terminal having a pin (rod) shape contacts.

The elastic member is a coil spring disposed inside the tubular member.

The upper plate is provided with the upper plate body, to which the plurality of upper side through holes are formed and on which the electrical part is mounted, and provided with a guide portion for guiding a peripheral edge portion of the electrical part. The guide portion may be formed to be detachable from the upper plate body.

According to the foregoing aspect of the present invention, by exchanging the guide portion for another one, another electrical part having a different size may be utilized.

The nature and further characteristic features of the present invention will be made more clear from the following descriptions made with reference to the accompanying drawings.

DESCRIPTION OF THE PREFERRED EMBODIMENTS

Figure 1:
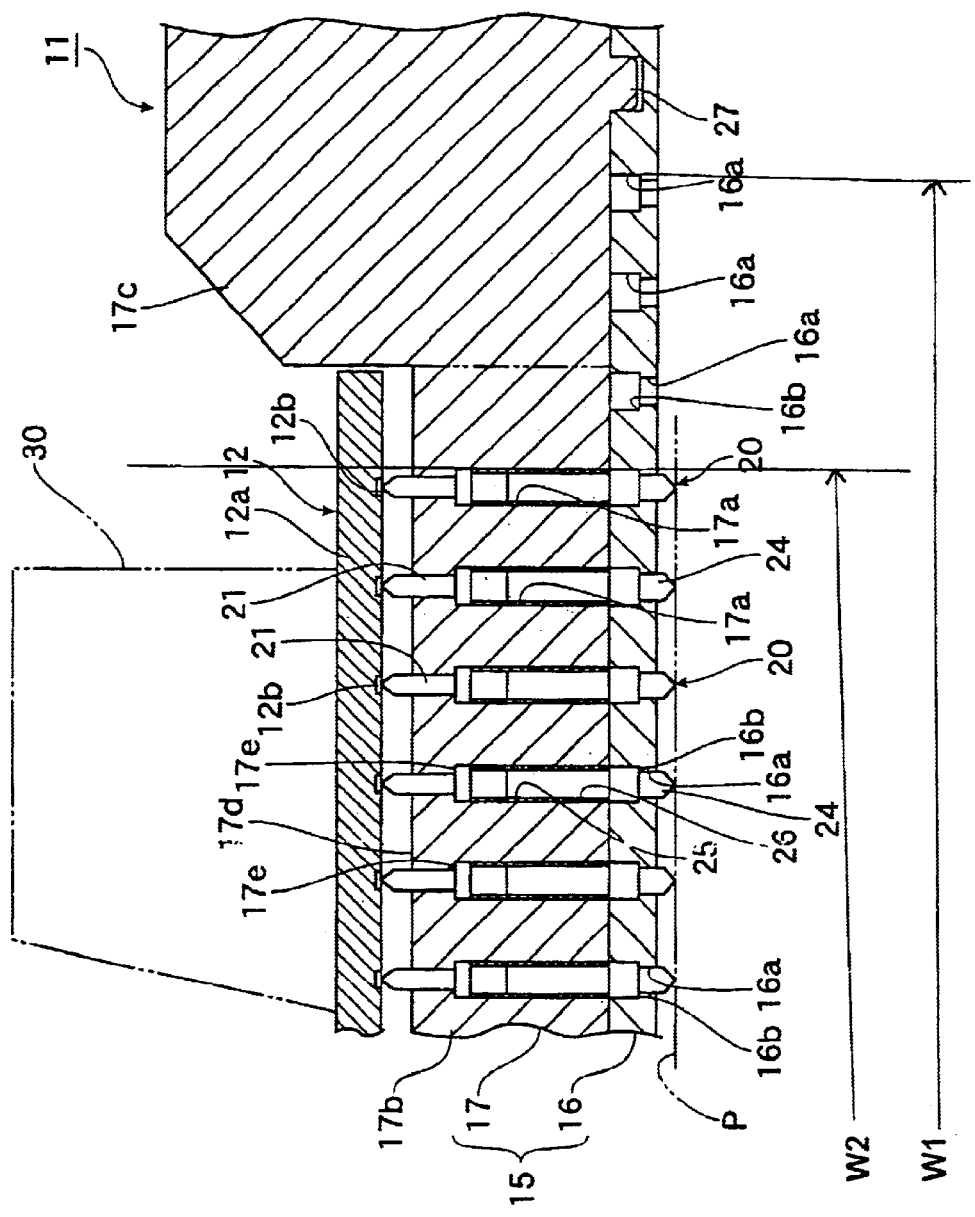
FIG. 1 is a sectional view of a portion of an IC socket for an LGA type according to an embodiment of the present invention.

Preferred embodiments of the present invention will be described hereunder with reference to FIGS. 1 to 6. Further, it is first to be noted that terms "upper", "lower" and the like are used herein with reference to illustrations of the figures of the drawings.

In these figures, reference numeral 11 denotes an IC socket as a socket for electrical parts, and the IC socket 11 is a socket for carrying out a performance test of IC packages 12, 13 and 14 of the IC packages as electrical parts through the electrical connection between these IC packages 12, 13 and 14 and a printed circuit board P.

In the present invention, the IC socket 11 can accommodate, selectively, three kinds of IC packages 12 (FIG. 1), 13 (FIG. 3) and 14 (FIG. 5) by merely changing some of constitutional parts or elements.

That is, the IC package 12 is so-called an LGA (Land Grid Array) type package having a structure in which land portions 12b as plate-like terminals are arranged to a lower surface of a package body 12a having a rectangular shape, as shown in FIG. 1.

Figure 3:
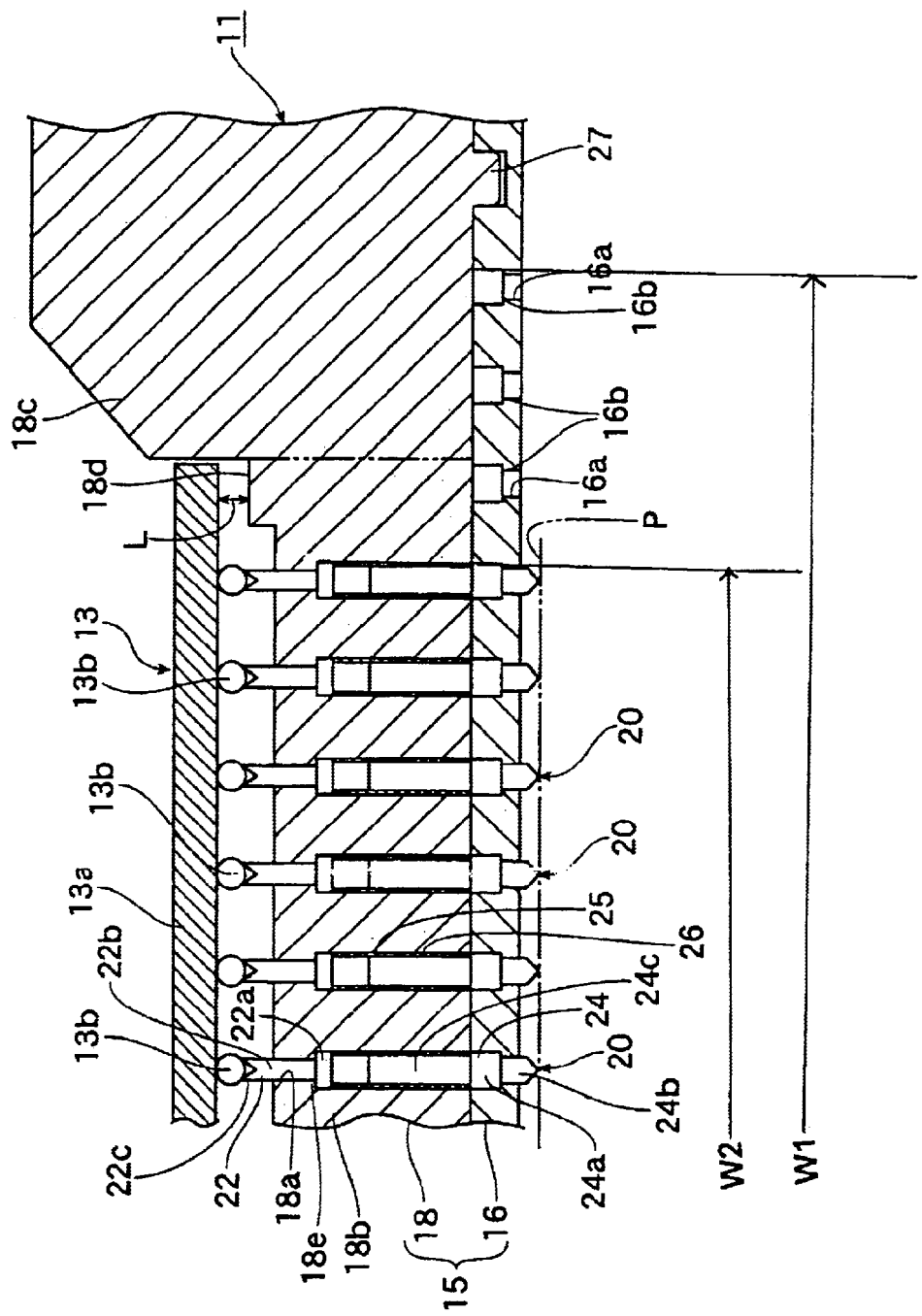
FIG. 3 is a sectional view of a portion of an IC socket for a BGA type according to another embodiment of the present invention.

The IC package 13 is so-called a BGA (Ball Grid Array) type package having a structure in which a number of solder balls 13b as terminals are arranged so as to project downward from a lower surface of a package body 13a having a rectangular shape, as shown in FIG. 3.

Figure 5:
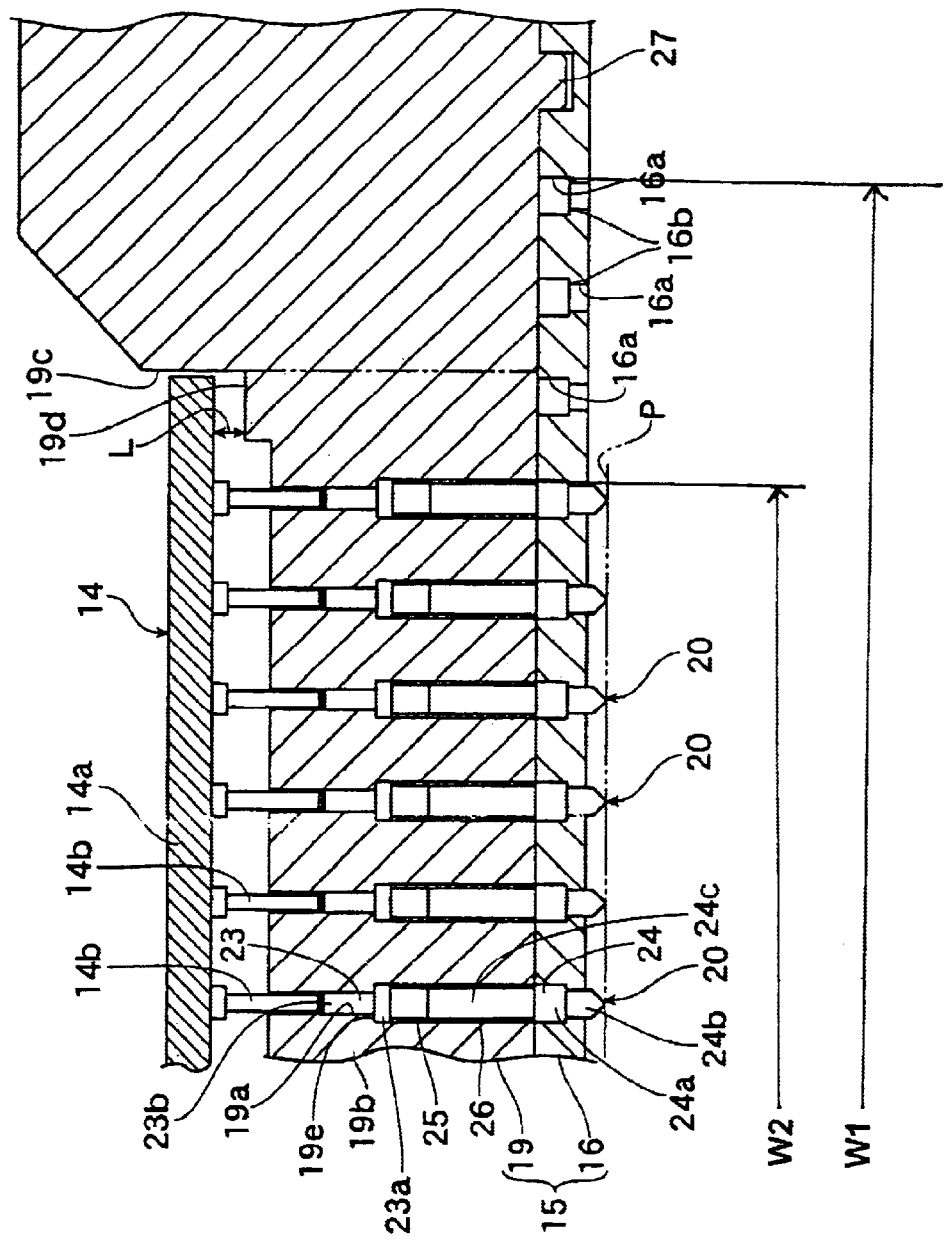
FIG. 5 is a sectional view of a portion of an IC socket for a PGA type according to a further embodiment of the present invention.

The IC package 14 is so-called a PGA (Pin Grid Array) type package having a structure in which a number of pins 14a as terminals are arranged so as to project downward from a lower surface of a package body 14a having a rectangular shape, as shown in FIG. 5.

The IC socket 11 is, on the other hand, composed of one kind (common type) of a lower plate 16 and either one of three types of upper plates 17, 18 and 19 which are selectively utilized for the above three-types of IC packages. A number of contact pins 20 are commonly arranged to the socket bodies 15 of the IC packages 12, 13 and 14.

In these upper plates 17, 18 and 19, the upper plate 17 is mounted to the lower plate 16 at the time of performance test of the LGA type IC package 12. Similarly, the upper plate 18 is mounted to the lower plate 16 at the time of performance test of the BGA type IC package 13, and the upper plate 19 is mounted to the lower plate 16 at the time of performance test of the PGA type IC package 14.

The lower plates 16 are formed with lower side through holes 16a, and the upper plates 17, 18 and 19 are also formed with upper side through holes 17a, 18a and 19a, respectively, with equal pitches, and each of the contact pins 20 extends through each pair of the lower side and upper side through holes.

A number of such lower side through holes 16a are formed in an arrangement range W1 which is wider than an arrangement range W2 of the upper side through holes 17a, 18a and 19a, as shown in FIG. 1, FIG. 3 and FIG. 5.

Furthermore, the upper plates 17, 18 and 19 in the respective embodiments are provided with upper plate bodies 17b, 18b and 19b formed with the upper side through holes 17a, 18a and 19a and provided with guide portions 17c, 18c and 19c for guiding the peripheral portions of the IC packages 12, 13 and 14, respectively. The guide portion may be formed to be detachable from the upper plate body. The upper plate bodies 17b, 18b and 19b are formed with seating portions 17d, 18d and 19d, respectively, on which the IC packages 12, 13 and 14 abut and are then placed.

One 17d of these seating portions of the upper plate 17 is formed from the upper surface portion of the upper plate body 17b.

Figure 2:
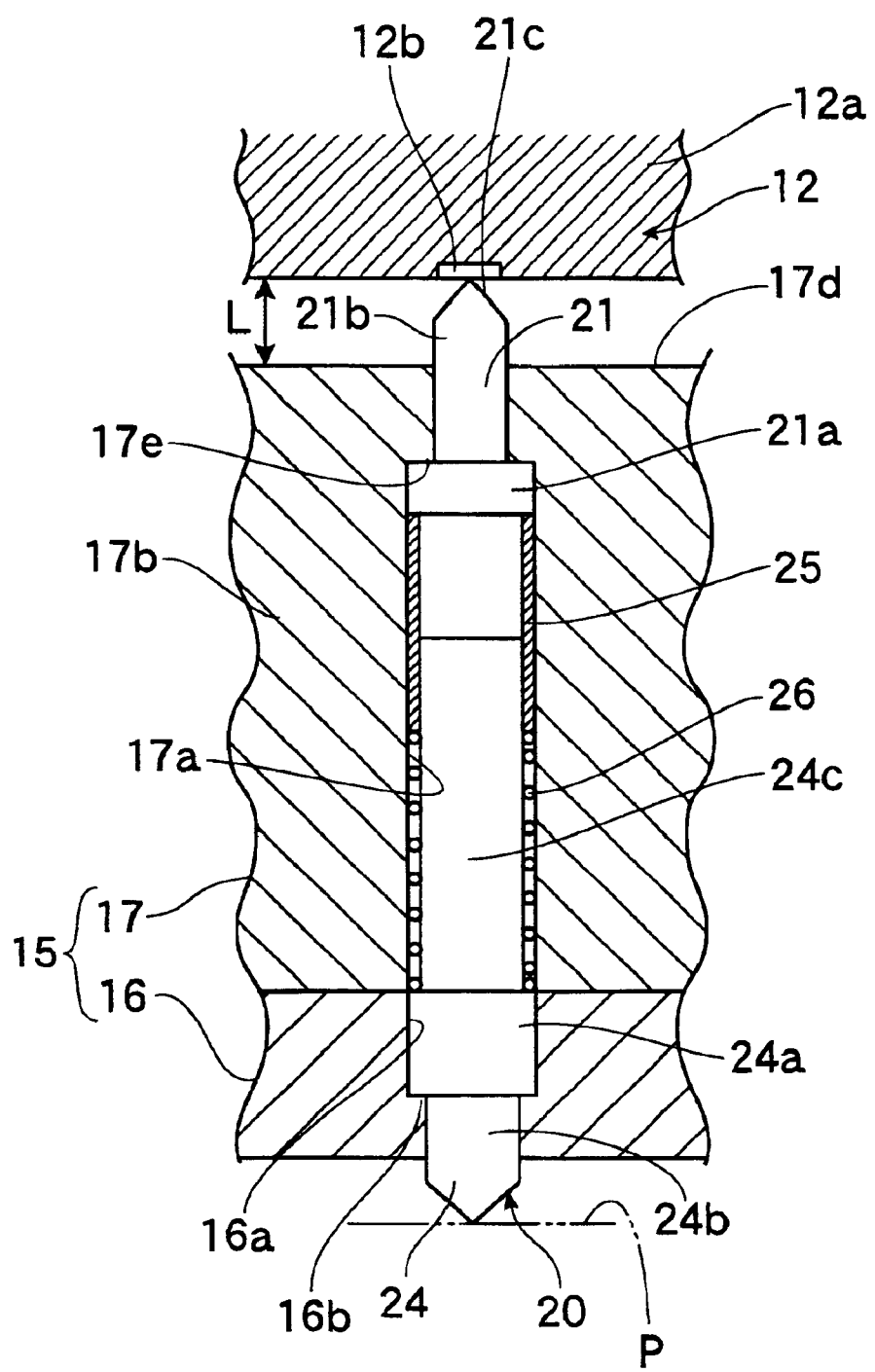
FIG. 2 is an enlarged sectional view of a portion, at which a contact pin of FIG. 1 is disposed, according to the embodiment of the present invention.
Figure 4:
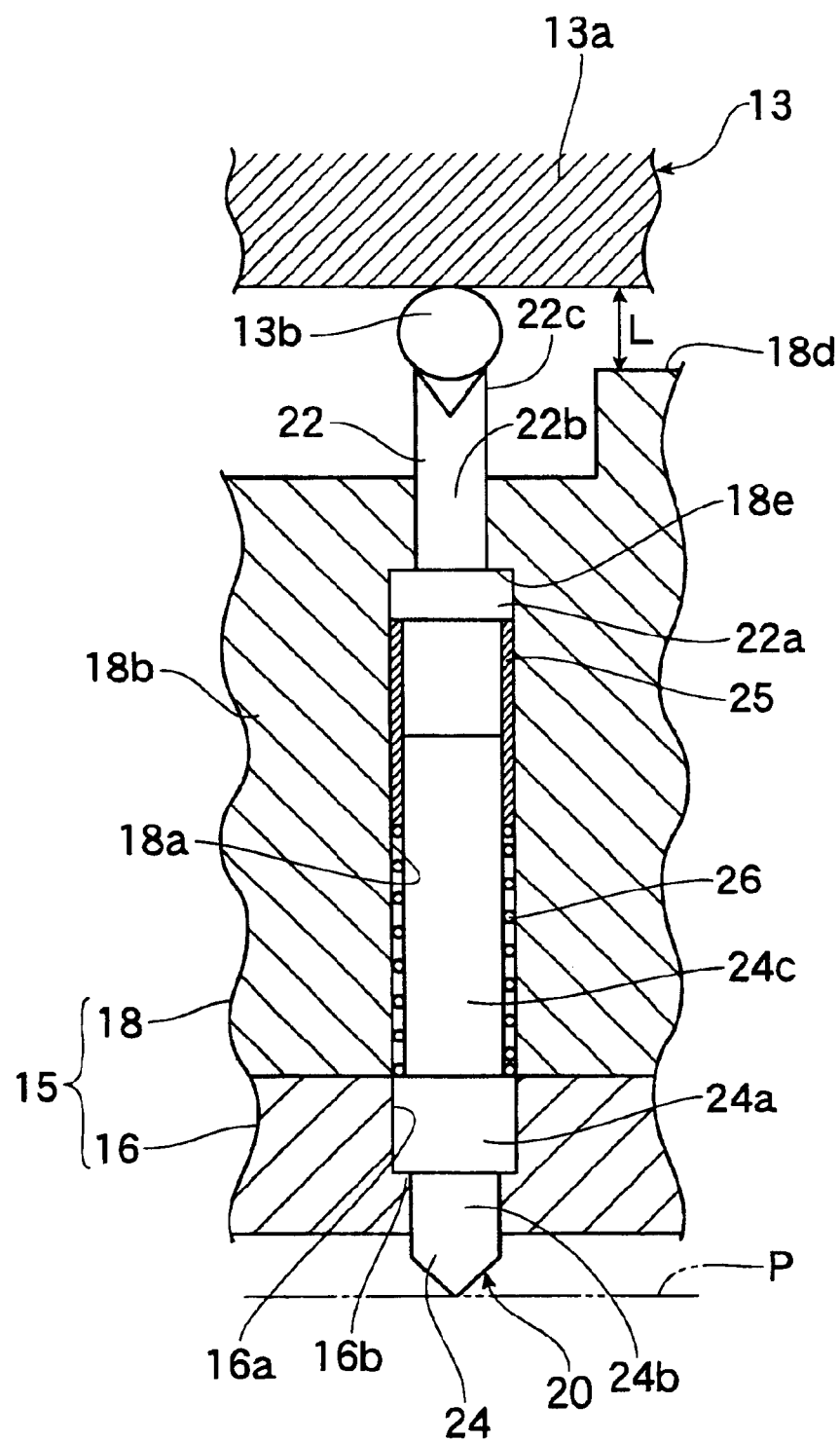
FIG. 4 is an enlarged sectional view of a portion, at which a contact pin of FIG. 3 is disposed, according to the embodiment of the present invention.
Figure 6:
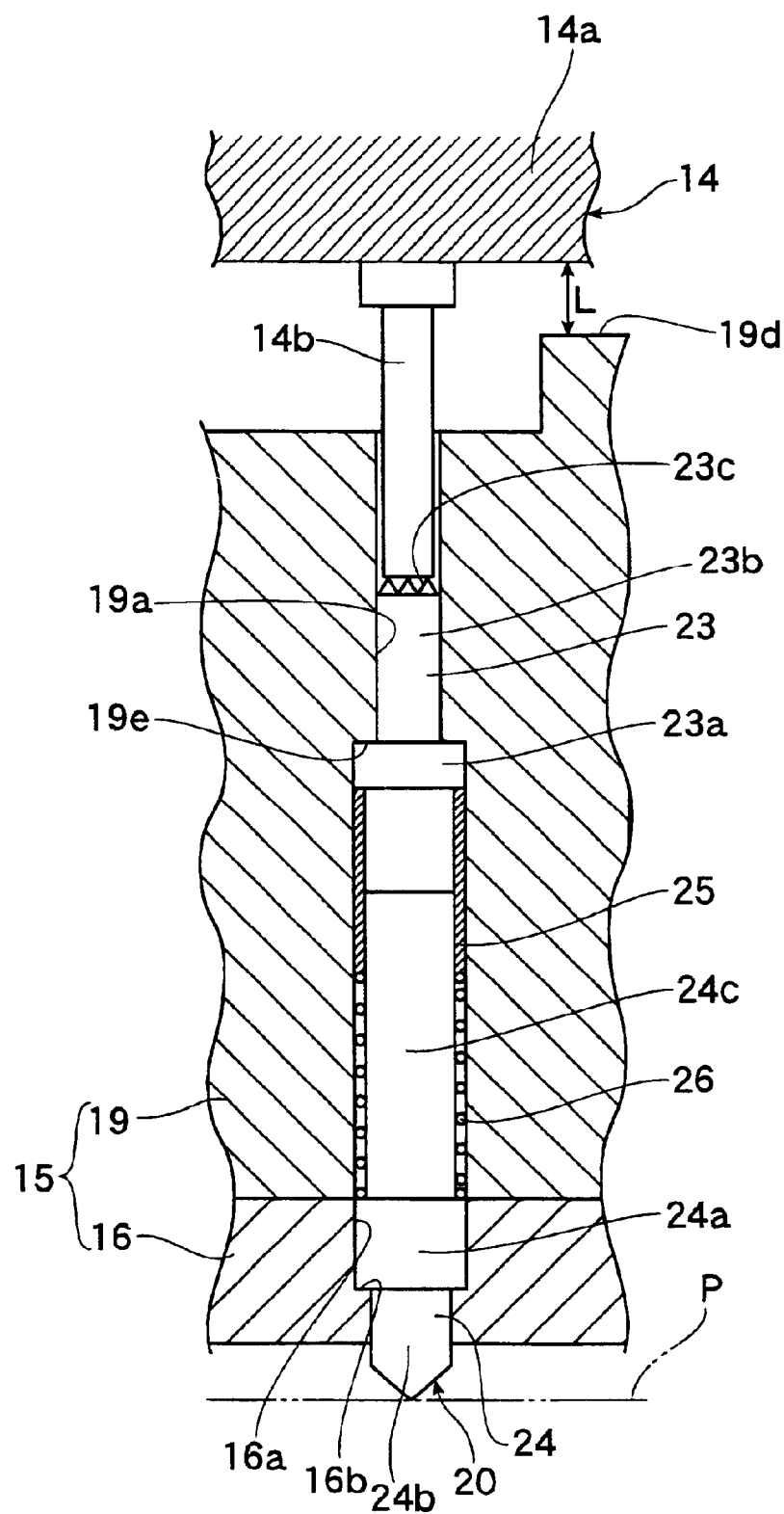
FIG. 6 is an enlarged sectional view of a portion, at which a contact pin of FIG. 5 is disposed, according to the embodiment of the present invention.

Further, these seating portions 17d, 18d and 19d have heights different from each other in accordance with the respective IC packages 12, 13 and 14, and as shown in FIGS. 2, 4 and 6, these heights are set so that press-in amount (distance) L of the IC package is set to be constant.

On the other hand, the contact pins 20 of the respective embodiments of FIGS. 1(2), (3)4 and 5(6), are formed from a conductive material. That is, the contact pin 20 of the embodiment of FIG. 1 comprises a first plunger 21, a second plunger 24, a tubular portion (member) 25 and a coil spring 26. The contact pin 20 of the embodiment of FIG. 3 comprises a first plunger 22, a second plunger 24, a tubular portion (member) 25 and a coil spring 26. The contact pin 20 of the embodiment of FIG. 5 comprises a first plunger 23, a second plunger 24, a tubular portion (member) 25 and a coil spring 26. As can be seen from the above, the first plunger portions 21, 22 and 23 are selectively formed, but other portions, i.e., second plunger 24, tubular portion 25 and coil spring 26, are common to the contact pins 20 of all the embodiments, and the three kinds of the first plungers 21, 22 and 23 are selected in accordance with the IC packages 12, 13 and 14 which are subjected to the performance tests.

The first plunger 21 of the contact pin 20 of FIG. 1(2) is one for the LGA type IC package 12 and comprises an end columnar stopper portion 21a and a rod-shaped portion 21b having a diameter smaller than that of the stopper portion 21a and projecting upward, as viewed in FIG. 2, therefrom, and the top end of the rod-shaped portion 21b is formed as a contact portion 21c having a mount shape (in section).

The first plunger 21 is inserted into the upper side through hole 17a of the upper plate 17 from the lower side thereof to be vertically movable and positioned when the upper portion of the columnar stopper portion 21a abuts against a stepped portion 17e formed to the through hole 17a to thereby prevent the first plunger 21 from coming off from the upper side of the through hole 17a. In the abutting state, the distal end of the rod-shaped portion 21b of the first plunger 21 projects over the upper surface of the upper plate 17.

On the other hand, the first plunger 22 shown in FIG. 3(4) is one for the BGA type IC package 13 and comprises an end columnar stopper portion 22a and a rod-shaped portion 22b as like as the first plunger 21 of the former embodiment. However, the top end of the rod-shaped portion formed as contact portion 22c is different from that 21c of the rod-shaped portion 21b. The contact portion 22c is formed so as to provide a V-shaped groove, into which is fitted a solder ball 13b contacting the contact portion 22c.

Furthermore, the first plunger 23 shown in FIG. 5(6) is one for the LGA type IC package 14 and comprises an end columnar stopper portion 23a and a rod-shaped portion 23b as like as the first plunger 21 of the former embodiment. However, the top end of the rod-shaped portion formed as contact portion 23c is different from that 21c of the rod-shaped portion 21b. The contact portion 23c is formed so as to provide a projected plural-mount shape, which contacts to a lower surface of a pin-shaped terminal 14b formed to the IC package 14.

Each of the tubular portions 25 as a common constitutional part of the contact pins 20 of the respective embodiments has a tubular (cylindrical) appearance and has both ends not caulked. The tubular portion 25 is fitted into the upper side through hole 17a, 18a and 19a of the upper plates 17, 18 and 19 to be vertically movable and, in the inserted state, opened upper end peripheral edges of the tubular portions 25 abut against the lower surfaces of the stopper portions 21a, 22a and 23a of the first plungers 21, 22 and 23 of the contact pins 20 of the respective embodiments.

The second plunger 24 of each embodiment comprises, as shown in FIG. 2, for example, an end columnar stopper portion 24a and a rod-shaped portion 24b extending downward, as viewed, from the stopper portion 24a and having a diameter smaller than that thereof, and the distal lower end of the rod-shaped portion 24b contacts the printed circuit board P. Further, the second plunger 24 is also provided with a shank portion 24c having a diameter smaller than that of the stopper portion 24a and extending upward therefrom to be slidable inside the tubular portion 25.

The second plunger 24 is inserted into the lower side through hole 16a of the lower plate 16 from the upper side thereof to be vertically movable. In the inserted state, the lower surface of the stopper portion 24a abuts against the stepped portion 16b formed to the lower side through hole 16a to thereby prevent the contact pin 20 from dropping out downward, and the lower end portion of the rod-shaped portion 24b projects downward from the lower surface of the lower plate 16.

Furthermore, the coil spring 26 is disposed between the upper surface of the stopper portion 24a of the second plunger 24 and the lower opened end peripheral edge of the tubular portion 25. The coil spring 26 acts to urge the first plunger 21 (22 or 23) and the second plunger 24 in directions separating from each other.

Then, the lower plate 16 and one of the upper plates 17, 18 and 19 are positioned by a reference pin 27 and fixed by bolt and nut means, not shown, to thereby arrange the contact pin 20 therebetween.

Further, for example, at a time when the performance test of the LGA type IC package 12 is carried out, the upper plate 17 is mounted to the lower plate 16 as shown in FIGS. 1 and 2, and the first plunger 21 is provided for the contact pin 20. The IC socket 11 is then fixed to the printed circuit board P and the IC package 12 is mounted on the upper plate 17, in which, in a state that any external force is not applied from the press member 30, the press-in amount L is kept.

Under the state, when the IC package 12 is depressed by the press member 30, the first plunger 21 and the tubular portion 25 are lowered against the urging force of the coil spring 26 with the land portion 12b of the IC package 12 abutting against the contact portion 21c of the contact pin 20. At a position in which the IC package 12 is lowered by the predetermined amount L, the IC package 12 abuts against the seating portion 17d of the upper plate 17, whereby the land portion 12b and the contact portion 21c are contacted to each other with a desired contacting pressure.

Furthermore, at a time when the performance test of the BGA type IC package 13 is carried out, the upper plate 18 of BGA type is mounted to the lower plate 16, as shown in FIGS. 3 and 4, in place of the upper plate 17 of LGA type, and the first plunger 22 for the BGA type IC package 13 is substituted for the first plunger 21 for the LGA type IC package 12 for constitutional component of the contact pin 20. The IC socket 11 is then fixed to the printed circuit board P and the IC package 13 is mounted on the upper plate 18, in which, in a state that any external force is not applied from the press member 30, the press-in amount L is kept as in the LGA type.

Under the state, when the IC package 13 depressed downward by the press member 30, the first plunger 22 and the tubular portion 25 are lowered against the urging force of the coil spring 26 with the solder ball 13b of the IC package 13 abutting against the contact portion 22c of the contact pin 20. At a position in which the IC package 13 is lowered by the predetermined amount L, the IC package 13 abuts against the seating portion 18d of the upper plate 18, whereby the solder ball 13b and the contact portion 22c contact each other with a desired contacting pressure. In this state, since the contact portion 22c is formed in shape of V-groove, the lowermost portion of the solder ball 13b does not contact the contact portion 22c at a wide range, and accordingly, the lowermost portion of the solder ball 13b is not damaged.

Still furthermore, at a time when the performance test of the PGA type IC package 14 is carried out, the upper plate 19 of PGA type is mounted to the lower plate 16, as shown in FIGS. 5 and 6, in place of the upper plate 18 of BGA type, and the first plunger 23 for the PGA type IC package 14 is substituted for the first plunger 22 for the BGA type IC package 13 for the constitutional component of the contact pin 20. The IC socket 11 is then fixed to the printed circuit board P and the IC package 14 is mounted on the upper plate 19, in which, in a state that any external force is not applied from the press member 30, the press-in amount L is kept as in the BGA type.

Under the state, when the IC package 14 depressed downward by the press member 30, the first plunger 23 and the tubular portion 25 are lowered against the urging force of the coil spring 26 with the pin-shaped terminal 14b of the IC package 14 abutting against the contact portion 23c of the contact pin 20. At a position in which the IC package 14 is lowered by the predetermined amount L, the IC package 14 abuts against the seating portion 19d of the upper plate 19, whereby the pin-shaped terminal 14b and the contact portion 23c are contacted to each other with a desired contacting pressure. In this state, since the contact portion 23c is formed with a plurality of projections, these projections abut against the pin-shaped terminal 14b, and hence, the conductive state at this portion can be ensured.

As mentioned above, the IC socket of the present invention is applicable to the IC packages 12, 13 and 14 of different kinds or types only by changing the upper plates 17, 18 and 19 and the first plunger 21, 22 and 23 with other elements or parts being common (not changed), thus being economical in comparison with the conventional structure.

Furthermore, according to the structure in which the arrangement range of the lower side through holes 16a of the lower plate 16 is set to be wider than the arrangement range of the upper side through holes 17a by changing the upper plate 17 (18, 19) to thereby change the arrangement range of the upper side through holes 17a, various IC packages such as 12, 13 and 14 having different sizes, number of terminal and the like can be effectively utilized. "In this example, the "arrangement range" is the distance from the left-most through hole 16a or 17a to the right-most through hole 16a or 17a." It is of course natural that the increasing the number of the terminal results in the increasing of the number of the contact pins.

Still furthermore, since the guide portions 17c, 18c and 19c are made separable from the upper plate bodies 17b, 18b and 19b at a portions shown by two dot lines in FIGS. 1, 3 and 5, and these guide portions are made detachable or exchangeable with respect to the upper plate bodies 17b, 18b and 19b, respectively, for other guide portions having different shapes, various IC packages having different sizes and dimensions can be easily used and handled.

It is to be noted that the present invention is not limited to the described embodiment and many other changes and modifications may be made without departing from the scopes of the appended claims.

For example, contact pins having other structures or shapes may be applicable. An upper plate is not limited to the described ones and other than the above-mentioned three kinds may be usable. Furthermore, the socket for electrical parts of the present invention may be applicable to so-called a clamshell type IC socket having a cover pressing an IC package or so-called an open-top type IC socket.

What is claimed is:

1. A socket for an electrical part comprising:
   a socket body; and
   a contact pin which is provided for the socket body and through which an electrical part having a terminal and a printed circuit board are electrically connected,
   said socket body having a lower plate to be mounted to the printed circuit board and an upper plate which is disposed on the lower plate and on which the electrical part is to be mounted, wherein said upper plate has a seating portion on which the electrical part is placed in a contacting manner,
   said lower plate and said upper plate being formed with a plurality of lower side through holes and a plurality of upper side through holes, respectively, the contact pin being inserted into a pair of the lower and the upper side through holes,
   said contact pin comprising:
      a first plunger electrically connected to the terminal of the electrical part,
      a second plunger electrically connected to the printed circuit board,
      a tubular member disposed between the first and the second plungers, and
      an elastic member, the elastic member and the tubular member being disposed between the first and the second plungers, the tubular member having an end portion detachably engaging with one of the first and the second plungers, and a portion slidably contacting with another one of the first and the second plungers,
   the elastic member urging the tubular member so that the tubular member can abut against one of the first and the second plungers, resulting in urging the first and the second plungers in opposite directions to each other.

2. A socket for an electrical part according to claim 1, wherein said contact pin is provided with a contact portion having a shape which is changed in accordance with a shape of the terminal of the electrical part.

3. A socket for an electrical part according to claim 1, wherein said first plunger is replaced with a replacement first plunger having a contact portion having a different shape from the first plunger in accordance with a shape of the terminal of the electrical part.

4. A socket for an electrical part according to claim 1, wherein said contact portion has a mount shape to which a terminal having a land shape contacts.

5. A socket for an electrical part according to claim 1, wherein said contact portion has a V-shaped groove to which a terminal having a solder ball shape contacts.

6. A socket for an electrical part according to claim 1, wherein said contact portion has a plural mount-shape to which a terminal having a pin shape contacts.

7. A socket for an electrical part according to claim 1, wherein said elastic member is a coil spring disposed at an inside of the tubular member.

8. A socket for an electrical part comprising:
   a socket body; and
   a contact pin which is provided for the socket body and through which an electrical part having a terminal and a printed circuit board are electrically connected,
   said socket body having a lower plate to be mounted on the printed circuit board and an upper plate which is disposed above the lower plate and on which the electrical part is mounted, wherein said upper plate has a seating portion on which the electrical part is placed in a contacting manner,
   said lower plate and said upper plate being formed with a plurality of lower side through holes and a plurality of upper side through holes, respectively, the contact pin being inserted into a pair of the lower side and the upper side through holes, said plurality of lower side through holes being formed in an arrangement range wider than that of the plurality of upper side through holes.

9. A socket for an electrical part according to claim 8, wherein said upper plate comprises:
   an upper plate body to which said plurality of upper side through holes are formed and on which the electrical part is mounted, and
   a guide portion for guiding a peripheral edge portion of the electrical part.

10. A socket for an electrical part according to claim 9, wherein said guide portion is formed to be detachable from the upper plate body.

11. A socket for an electrical part according to claim 1, wherein the upper plate is designed to be replaced with a replacement upper plate having a seating portion of a different height from the upper plate.

12. A socket for an electrical part according to claim 1, wherein the upper side through holes and the lower side through holes respectively have equal pitches, and each of the contact pins extends through each pair of the lower side and the upper side through holes.

13. A socket for an electrical part according to claim 1, wherein the first plunger has a first stopper portion and a first projection portion and the second plunger has a second stopper portion and a second projection portion, and
   the upper side through hole has a first stepped portion corresponding to the first stopper portion of the first plunger so as to prevent the first plunger from coming off from an upper side of the upper side through hole, and the lower side through hole has a second stepped portion corresponding to the second stopper portion of the second plunger so as to prevent the second plunger from coming off from a lower side of the lower side through hole.

14. A socket for an electrical part according to claim 13, wherein in the upper side through hole, the first plunger, the tubular member, and the elastic member have a same inner and a same outer diameter as the tubular member and are disposed in order from top to bottom, and in the lower side through hole, the second plunger is disposed so that a peripheral portion of an upper surface opposite to the second stopper portion of the second plunger abuts a lower portion of the coil spring, a shank portion projecting upward from the upper surface opposite to the second stopper portion of the second plunger is inserted, via the coil spring, into the inside of the tubular member to slidably engage with the tubular member.

15. A method of assembling a socket for an electrical part comprising a socket body and a contact pin which is provided for the socket body and through which an electrical part having a terminal and a printed circuit board are electrically connected, said contact pin having an elastic member urging a plunger upward, said socket body having a lower plate to be mounted to the printed circuit board and an upper plate which is disposed on the lower plate and has a seating portion on which the electrical part is placed in a contacting manner, the method comprising:

preparing a plurality of the upper plates with respect to the lower plate, each upper plate having the seating portion of a different height;

selecting one of the upper plates in accordance with the electrical part to be tested so that a press-in amount becomes a predetermined same amount, the press-in amount being a distance between the seating portion and a lower portion of an electrical part body of the electrical part when the terminal is mounted on the first plunger and an external force is not applied on the electrical part from a press member; and assembling the selected upper plate detachably but immovably on the lower plate.

16. A socket for an electrical part comprising:

a socket body; and a contact pin which is provided for the socket body and through which an electrical part having a terminal and a printed circuit board are electrically connected, said socket body having a lower plate to be mounted to the printed circuit board and an upper plate which is disposed above the lower plate and on which the electrical part is to be mounted, wherein said upper plate has a seating portion on which the electrical part is placed in a contacting manner, said lower plate and said upper plate being formed with a plurality of lower side through holes and a plurality of upper side through holes, respectively, the contact pin being inserted into a pair of the lower and the upper side through holes, said contact pin comprising:
a first plunger electrically connected to the terminal of the electrical part,
a second plunger electrically connected to the printed circuit board,
a tubular member disposed between the first and the second plungers, and
an elastic member disposed between the first and second plungers to urge the first and second plungers in opposite directions, said tubular member having an end portion detachably engaging with one of the first and the second plunger, and a portion sliding within the upper plate and contacting with another one of the first and the second plungers.

17. A socket for an electrical part comprising:

a socket body; and a contact pin which is provided for the socket body and through which an electrical part having a terminal and a printed circuit board are electrically connected, the contact pin having a contact portion contacting the terminal, the contact portion being urged toward the electrical part and being movable against an urging force when the terminal abuts against the contact portion, said socket body having a lower plate to be mounted to the printed circuit board and an upper plate which is detachably but immovably disposed on the lower plate and on which the electrical part is to be mounted, said upper plate having a seating portion on which the electrical part is placed in a contacting manner, the upper plate being designed to be replaced with another upper plate having a press-in amount which is the same as the upper plate, the press-in amount being a distance between a position where the terminal is abutted against the contact portion of the contact pin and a position where the electrical part is abutted against the seating portion.

* * * * *